United States Patent [19]

An

[11] Patent Number: 5,367,488
[45] Date of Patent: Nov. 22, 1994

[54] DRAM HAVING BIDIRECTIONAL GLOBAL BIT LINES

[75] Inventor: Jin H. An, Kyungki-do, Rep. of Korea

[73] Assignee: Goldstar Electron Co., Ltd., Cheongju, Rep. of Korea

[21] Appl. No.: 33,716

[22] Filed: Mar. 18, 1993

[30] Foreign Application Priority Data

Mar. 18, 1992 [KR] Rep. of Korea ............... 92-4295

[51] Int. Cl.$^5$ .............................................. G11C 7/00
[52] U.S. Cl. ............................... 365/189.01; 365/202; 365/203; 365/207; 365/230.03
[58] Field of Search ............... 365/189.01, 202, 203, 365/207, 230.03, 230.05

[56] References Cited

U.S. PATENT DOCUMENTS

| | | | |
|---|---|---|---|
| 5,047,984 | 9/1991 | Monden | 365/203 |
| 5,091,889 | 2/1992 | Hamano et al. | 365/203 |
| 5,111,434 | 5/1992 | Cho | 365/207 |
| 5,202,854 | 4/1993 | Koike | 365/203 |
| 5,233,560 | 8/1993 | Foss et al. | 365/203 |
| 5,247,482 | 9/1993 | Kim | 365/203 |
| 5,255,235 | 10/1993 | Miyatake | 365/203 |

Primary Examiner—Eugene R. LaRoche
Assistant Examiner—Tan Nguyen
Attorney, Agent, or Firm—Alan R. Loudermilk

[57] ABSTRACT

A DRAM having bidirectional global bit lines is defined such that local bit lines connected to corresponding memory cells and separative global bit lines connected to the local bit lines are commonly connected to local bit lines so as to read data stored in the cells or write data to the cells in a bidirectional data access manner. According to the DRAM of the present invention, the sense amplifiers, input and output lines and switching elements for column decoding, which generally are located between adjacent cell arrays, can be advantageously positioned without decreasing the characteristics of the DRAM element. In addition, the DRAM of the present invention employs an open bit line structure rather than a folded bit line structure, thereby improving a packing effect as well as a S/N (signal-to-noise) characteristic, remarkably.

20 Claims, 6 Drawing Sheets

DRAM HAVING BIDIRECTIONAL GLOBAL BIT LINES

BACKGROUND OF THE INVENTION

1. Field of the Invention

The present invention relates to a dynamic random access memory (DRAM) having open bit lines, and more particularly to a DRAM having bidirectional global bit lines in which local bit lines connected to corresponding memory cells and separative global bit lines connected to the local bit lines are commonly connected so that data may be read from or stored in the cells in a bidirectional manner.

2. Description of the Prior Art

Figure 1A:
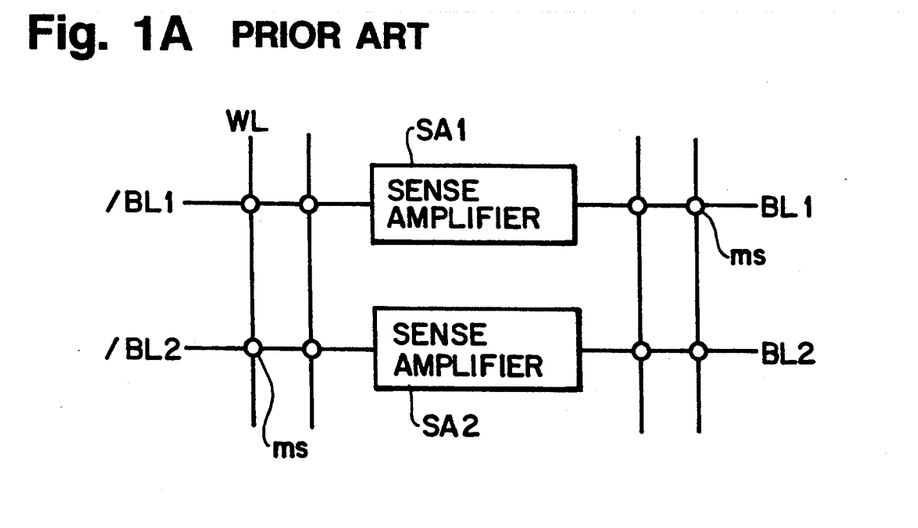
FIG. 1A and FIG. 1B illustrate an example of a DRAM of a conventional open bit line structure.

In general, DRAMs typically are divided into folded bit line and open bit line structures. More specifically, FIG. 1 (A) illustrates such a DRAM of an open bit line structure. A pair of local bit lines (e.g., BL1 and /BL1) ("/" typically denotes herein complementary lines or signals or active low signals) are provided at the right and left sides of sense amplifiers SA1 and SA2. Word lines WL (WL1-WLn) intersect the local bit lines and memory cells ms are serially arranged at the intersections of the local bit lines and word lines.

Figure 1B:
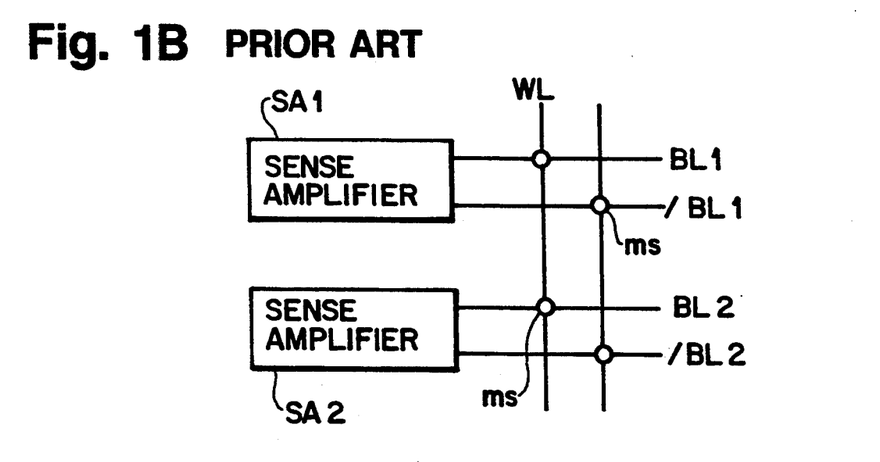

FIG. 1 (B) illustrates such a DRAM of a folded bit line structure. As indicated, a pair of local bit lines BL and /BL are connected to one side of sense amplifiers SA1 and SA2. Word lines WL intersect the local bit lines and memory cells ms are alternatively arranged at the intersections of local bit lines BL and/BL and word lines WL.

Figure 2:
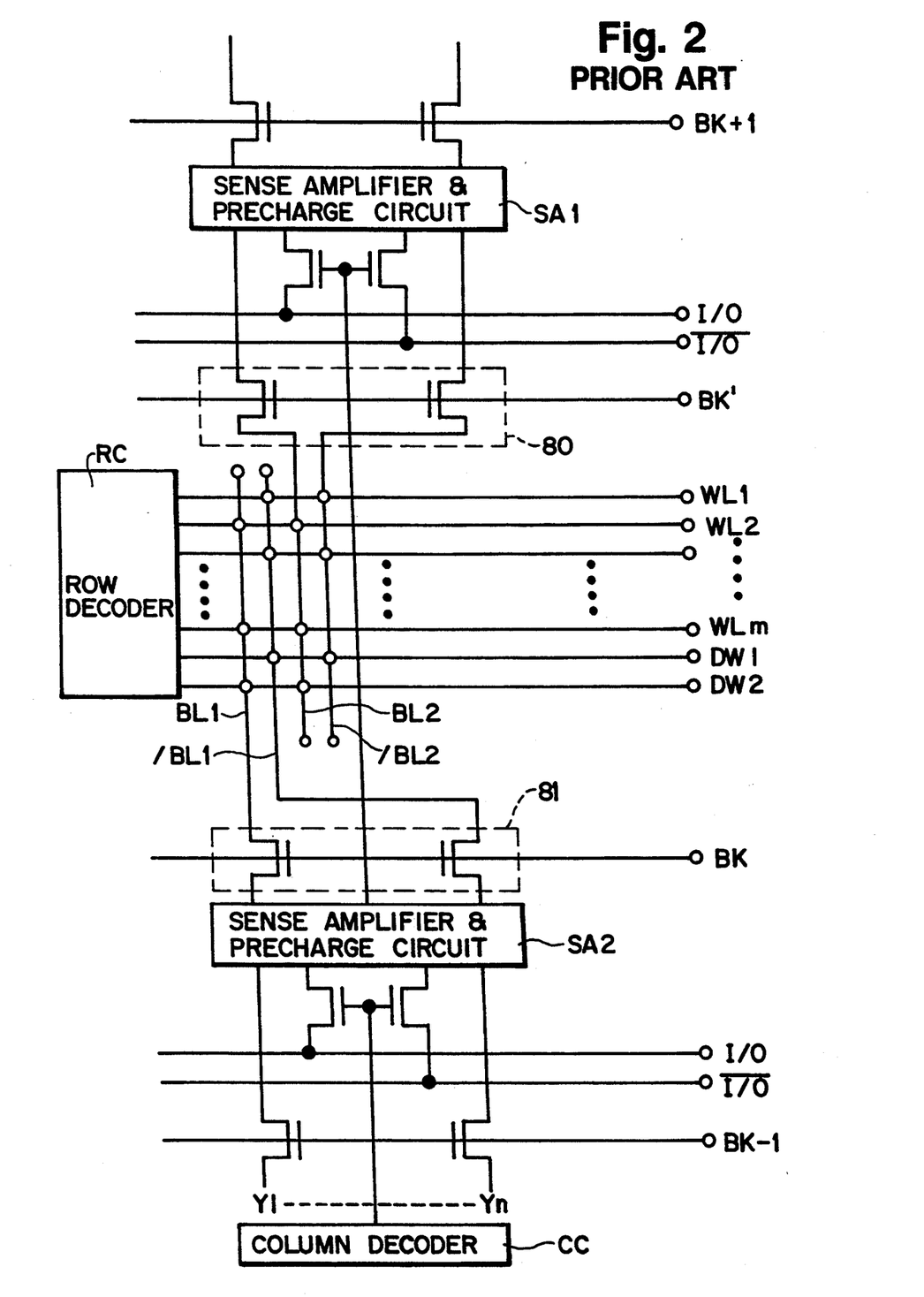
FIG. 2 illustrates an example of a DRAM of a conventional folded bit line structure.

Moreover, as illustrated in FIG. 2, in a DRAM of such a folded bit line structure, word lines WL are connected to row decoder RC. Odd-numbered bit lines BL and/BL (i.e., BL1 and /BL1, BL3 and /BL3, . . . ) are connected to second sense amplifier and precharge circuit SA2 via switching portion 81 which is activated by way of external signal BK to separate local bit lines BL and /BL, while even-numbered bit lines BL and/BL (i.e., BL0 and /BL0, BL2 and /BL2 . . . ) are connected to first sense amplifier and precharge circuit SA1 via switching portion 80 which is activated by signal BK'. Further, cell selecting signals Y1 to Yn produced by column decoder CC are commonly connected to first and second sense amplifier and precharge circuits SA1 and SA2. Then, data in the cells selected by cell selecting signals Y1 to Yn are supplied to external circuits (not shown) through input and output lines I/O and /I/O.

Figure 3:
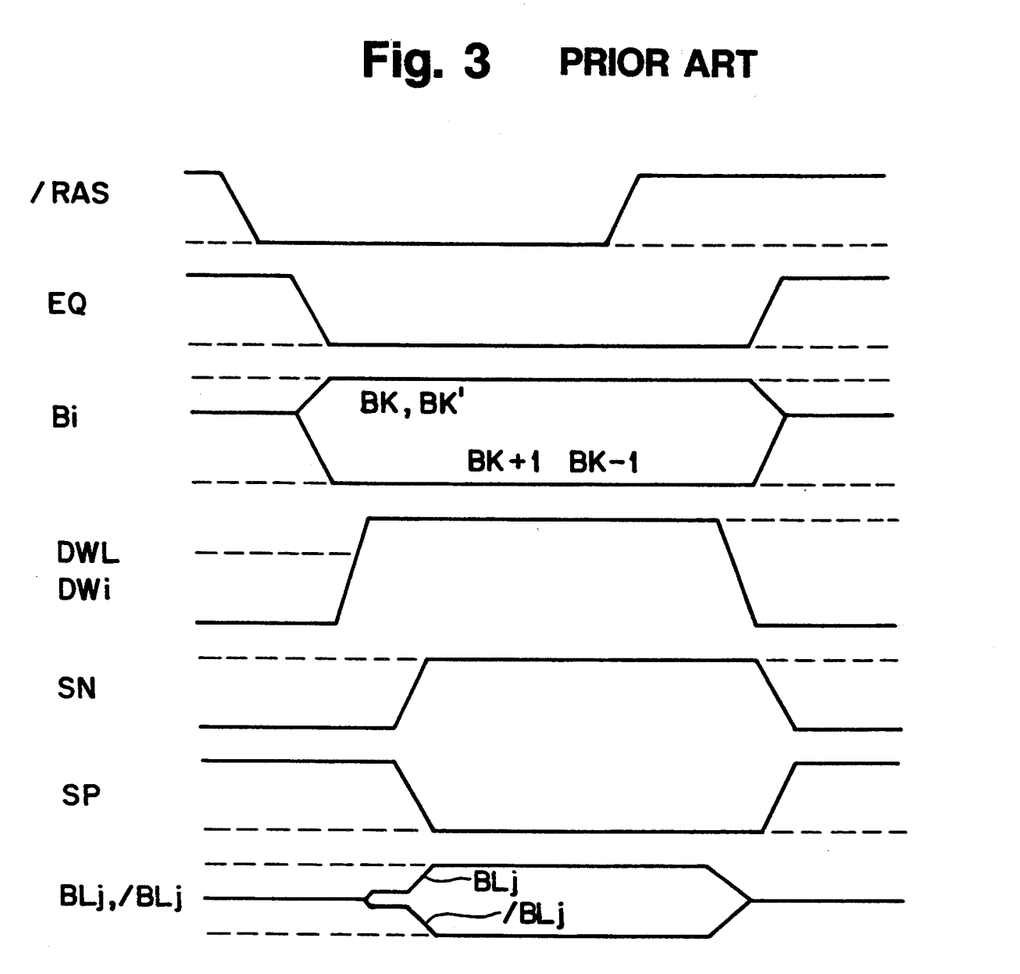
FIG. 3 is a timing chart illustrating the operation of a conventional DRAM.

More specifically, as illustrated in FIG. 3, when an external row address strobe (/RAS) signal is changed from a high level to a low level, a row address is latched into an internal circuit (for example, row decoder RC) and equalizing signal EQ somewhat delayed with respect to the RAS signal then becomes a low level (see FIG. 3). Accordingly, the equalizing operation for local bit lines BL and /BL is stopped so that the local bit lines are separated from precharging voltage VBL. At this time, signals BK and BK' have a higher level than a level defined by Vcc+Vth. That is, if any one of word lines WL1 to WLn is selected by column decoder CC, then all of signals BK and BK' become a high level, while signals BK+1 and Bk−1 are changed to a low level, so that switching portions 80 and 81 are rendered conductive or turned ON. Consequently, the word line thus selected is changed to a high level by way of the row address. Accordingly, charges stored in the selected cell appear on one of local bit lines BL and /BL, so that the voltage of that local bit line is somewhat increased or decreased depending upon the charge of the cell. Under this condition, if signal SN serving as a sense amplifier enable signal becomes a high level and signal SP serving as a sense amplifier enable signal becomes a low level, then the voltage difference between the local bit lines is enlarged. As a result, the data stored in the cell is transferred to the input and output lines I/O and /I/O via sense amplifier and precharge circuits SA1 and SA2.

With the DRAM of a folded bit line structure described above, however, it requires sense amplifier and precharge circuits, input and output lines, switching portions for column decoding and the switching circuit for connecting the local bit lines to the sense amplifier and precharge circuits. Accordingly, multiple FETs of sixteen or more, in addition to the word line forming area, must be connected to each pair of the local bit lines and, thus, the FETs occupy a relatively large area such as an element isolation area defined between NMOS and PMOS elements, thereby undesireably decreasing the efficiency of the cells.

SUMMARY OF THE INVENTION

Accordingly, an object of the present invention is to provide a DRAM having bidirectional global bit lines which can achieve bidirectional read and write of data stored in memory cells. To achieve the above object according to the present invention, there is provided a DRAM having an open bit line structure, comprising: a plurality of cell blocks; a plurality of local bit lines connected to corresponding cells in the cell blocks; first and second precharge circuits connected to a side of the local bit lines; global bit lines disposed at the right and left sides of two adjacent local bit lines; first and second sense amplifiers connected to opposed ends of the global bit lines, respectively; a first switching portion provided at each of the word line blocks for separating the centers of the global bit lines; and, second and third switching portions provided at each of the cell array blocks for connecting the local bit lines and the global bit lines, the second switching portion being connected to the right global bit lines and the third switching portion being connected to the left global bit lines so that data stored in the cell selected by first and second row decoders connected to the word lines and a column decoder is read out from or rewritten to data input/output lines through the local bit lines and global bit lines via the first and second sense amplifiers.

The above and other objects, features and advantages of the present invention will be apparent from the following description taken with reference to the accompanying drawings.

DETAILED DESCRIPTION OF THE PREFERRED EMBODIMENTS

Hereinafter, the present invention will be described in detail.

Figure 4:
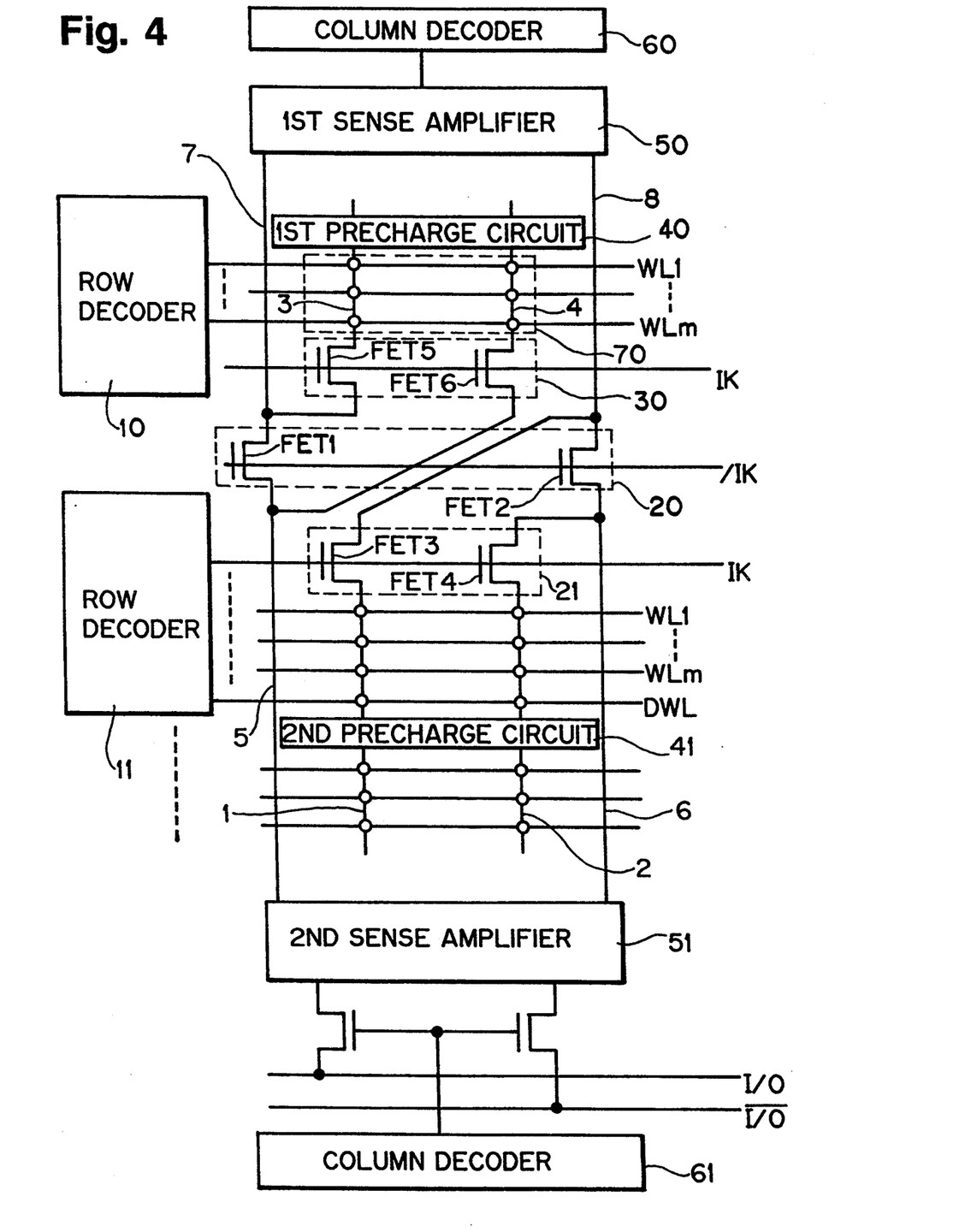
FIG. 4 illustrates a DRAM having a bidirectional global bit line of an open bit line structure according to one embodiment of the present invention.

Referring now to FIG. 4, a DRAM according to one embodiment of the present invention will be described. An end of transistor FET3 which forms a part of second switching portion 21 is connected to the upper stage of right global bit line 8 and an end of transistor FET4 which also forms a part of second switching portion 21 is connected to the lower stage of right global bit line 6. An end of transistor FET5 which forms a part of third switching portion 30 is connected to the upper stage of left global bit line 7, and an end of transistor FET6 is connected to the lower stage of left global bit line 5.

Figure 5:
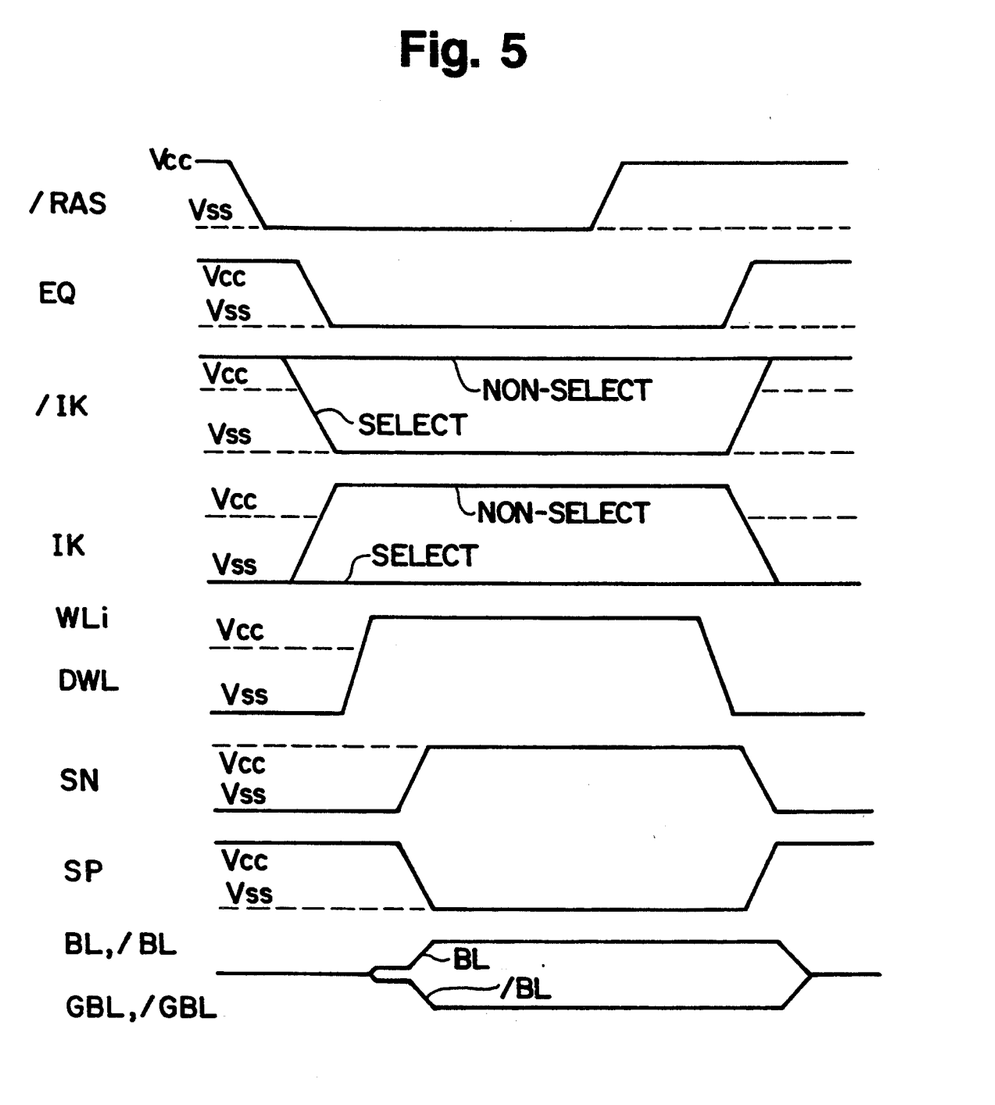
FIG. 5 is a timing chart for explaining the operation of the DRAM illustrated in FIG. 4.

First, as seen from FIG. 5, which illustrates a timing chart for the present invention, if an external /RAS signal is lowered to level Vss, then a row address is latched into row decoders 10 and 11, and equalizing signal EQ is somewhat delayed with respect to the /RAS signal and lowered to level Vss in accordance with the row address. Accordingly, the equalizing operation for precharge circuits 40 and 41 is stopped, and precharge circuits 40 and 41 are thus separated from equalization voltage VBL.

At this time, if a cell block selecting signal /IK selected by the row address is lowered to level Vss, transistors FET1 and FET2 forming first switching portion 20 are turned OFF and the global bit lines are thus divided into two parts, that is, the upper stage lines 7 and 8, and the lower stage lines 5 and 6. In this case, cell block selecting signal IK having a polarity opposed to signal /IK becomes a high level and transistors FET3, FET4, FET5 and FET6 forming second and third switching portions 21 and 30, respectively, are turned ON.

Subsequently, if any one of word lines WL (i.e., WL1, WL2, ..., WLm) which intersect local bit lines 1 and 2 is selected by means of row decoder 11, then the word line thus selected becomes a high level. According to the DRAM of the present invention, data stored in the cell connected to the selected local bit line 1 is transferred to first sense amplifier 50 through transistor FET3 of second switching portion 21 and global bit line 8.

Similarly, data stored in the cell connected to the adjacent local bit line 2 is transferred to second sense amplifier 51 through transistor FET4 of second switching portion 21 and global bit line 6. As a result, the data can be bidirectionally transferred through transistors FET3 and FET4 of second switching portion 21 and global bit lines 8 and 6. Meanwhile, data stored in the cell connected to local bit line 3 is supplied to first sense amplifier 50 through transistor FET5 of third switching portion 30 and the upper stage of left global bit line 7, and data in the cell connected to adjacent local bit line 4 is supplied to second sense amplifier 51 through transistor FET6 of third switching portion 30 and the lower stage of left global bit line 5.

For example, if a word line WL is selected by row decoder 11, then the cell data appearing on local bit lines 1 and 2 are transferred to global bit lines 8 and 6, respectively. At this time, remaining global bit lines 5 and 7 are maintained in an originally precharged state because none of the word line blocks are selected by row decoder 10. As a result, a difference in voltage occurs between the pairs of upper and lower global bit lines 7 and 8, and 5 and 6, and enable signals SN and SP with respect to first and second sense amplifiers 50 and 51 are changed into a high level or low level, respectively, enabling the sense amplifiers. Accordingly, global bit lines 5 and 8 and local bit lines 1 to 4 have a potential that is enlarged in a range between Vcc and Vss. Thereinafter, first and second sense amplifiers 50 and 51 which are selected by column decoders 60 and 61 function to transfer the sensed data to the input and output lines I/O and $\overline{I/O}$.

Figure 6:
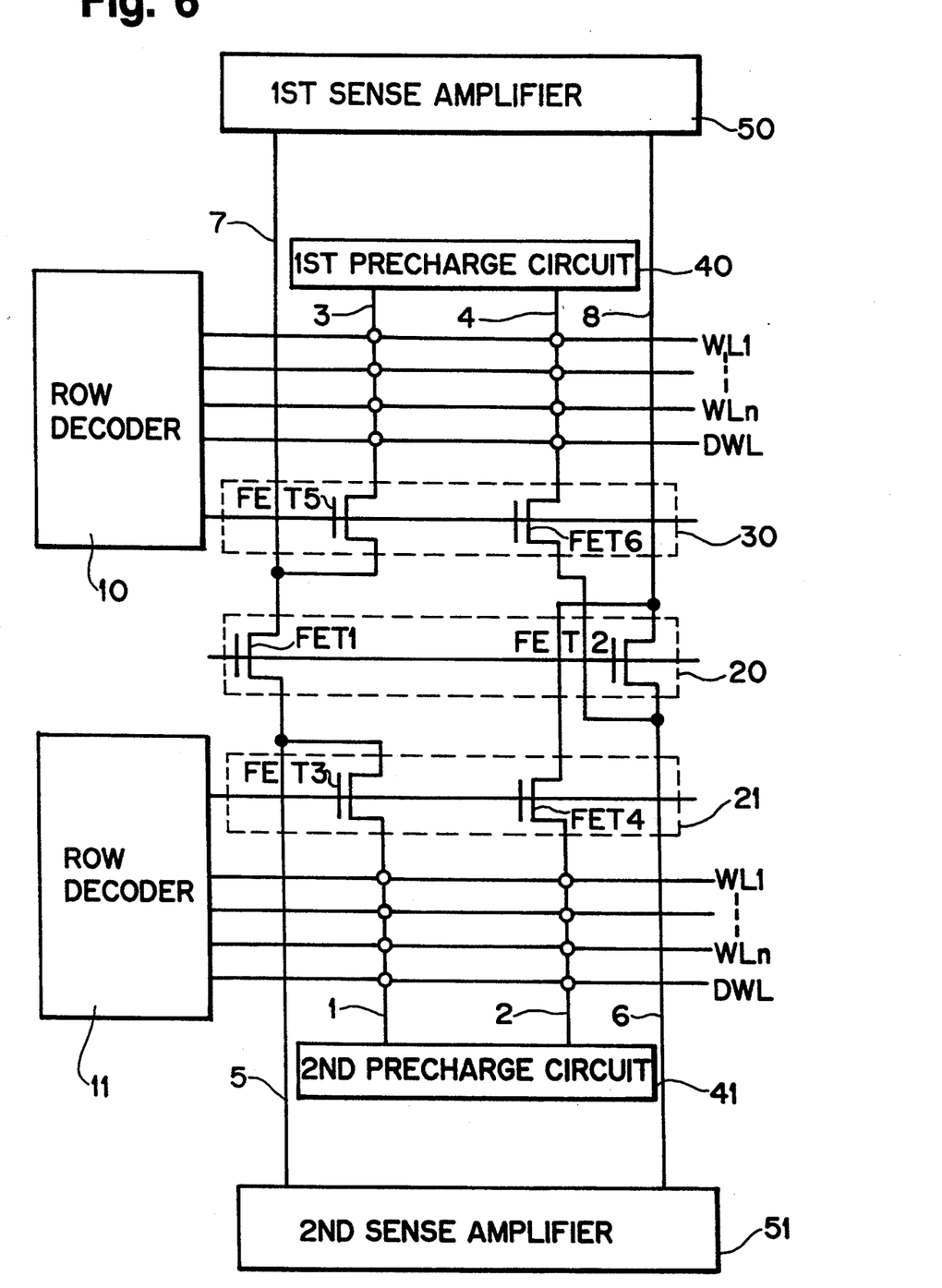
FIG. 6 illustrates a DRAM according to another embodiment of the present invention.

FIG. 6 illustrates another embodiment of the present invention, in which like reference numerals denote the same elements or components of the embodiment described in FIG. 4. As illustrated, first switching portion 20 is connected between the upper and lower stages of the global bit lines. Second switching portion 21 is connected to the upper stage of right global bit line 8 and the lower stage of left global bit line 5. More specifically, in second switching portion 21, an end of transistor FET3 is connected to the lower stage of left global bit line 5, and an end of transistor FET4 connected to the upper stage of right global bit line 8. Also, in third switching portion 30, an end of transistor FET5 is connected to the upper stage of left global bit line 7 and an end of transistor FET6 is connected to the lower stage of right global bit line 6.

In accordance with another embodiment of the present invention thus constructed, if block selecting signal /IK which is selected by way of a row address is lowered to level Vss, then transistors FET1 and FET2 of first switching portion 20 are turned OFF and the global bit lines are separated into an upper stage and a lower stage. At this time, the block selecting signal IK having polarity opposed to the signal /IK, which is affected by the row address, becomes a high level and transistors FET3 to FET6 of second and third switching portions 21 and 30 are turned ON. Subsequently, if any one of word lines WL (i.e., WL1, WL2, ... WLn) which intersect local bit lines 1 and 2 is selected by means of row decoder 11, then the bit line thus selected becomes a high level.

According to the DRAM of the present invention, data stored in the cell connected to the selected local bit line 1 is transferred to second sense amplifier 51 through transistor FET3 of second switching portion 21 and global bit line 5. Similarly, data stored in the cell connected to the adjacent local bit line 2 is transferred to first sense simplifier 50 through transistor FET4 of second switching portion 21 and global bit line 8. As a result, data can be bidirectionally transferred through transistors FET3 and FET4 of second switching portions 21 and global bit lines 5 and 8. Meanwhile, data stored in the cell connected to local bit line 3 is supplied to first sense amplifier 50 through transistor FET5 of third switching portion 30 and the upper stage of left global bit line 7, and data in the cell connected to the adjacent local bit line 4 is supplied to second sense amplifier 51 through transistor FET6 of third switching portion 30 and the lower stage of right global bit line 6, with first and second sense amplifiers 50 and 51 being operated as previously described.

As noted above, according to the DRAM of the present invention, the sense amplifiers, input and output lines and switching elements for column decoding, which are generally located between adjacent cell arrays, can be moved without decreasing the characteristics of the DRAM element. In addition, since the DRAM of the present invention employs an open bit line structure rather than a folded bit line structure, a packing effect as well as signal to noise characteristic of the DRAM can be improved remarkably.

Although the present invention has been described with respect to certain preferred embodiments, it will be apparent that various changes and modifications can be made therein without departing from the scope and spirit of the invention.

What is claimed is:

1. A DRAM having an open bit line structure, comprising:
    a plurality of cell array blocks each having a plurality of memory cells;
    a plurality of local bit lines connected to memory cells in the blocks;
    first and second precharge circuits connected to the local bit lines;
    global bit lines disposed at the right and left sides of at least two adjacent local bit lines, each of the global bit lines having a central portion positioned between an upper stage of the global bit line and a lower stage of the global bit line;
    first and second sense amplifiers connected to opposed ends of the global bit lines, respectively;
    a plurality of word line blocks having word lines that intersect the local bit lines for selecting particular memory cells;
    a first switching portion coupled to the central portion of the global bit lines for separating the upper and lower stages of the global bit lines; and
    second and third switching portions provided for each of the cell array blocks for connecting the local bit lines and the global bit lines, the second switching portion being connected to the right global bit lines and the third switching portion being connected to the left global bit lines, wherein data stored in a selected memory cell is read out or rewritten to data output lines through the local bit lines and global bit lines via the first and second sense amplifiers.

2. A DRAM having an open bit line structure according to claim 1, wherein at least one of two bit lines connected to the second switching portion is connected to the upper stage of the right global bit line and the other of the two bit lines connected to the second switching portion is connected to the lower stage of the right global bit line, and at least one of two bit lines connected to the third switching portion is connected to the upper stage of the left global bit line and the other of the two bit lines connected to the third switching portion is connected to the lower stage of the left global bit line.

3. A DRAM having an open bit line structure according to claim 1, wherein at least one of two bit lines connected to the second switching portion is connected to the lower stage of the left global bit line and the other of the two bit lines connected to the second switching portion is connected to the upper stage of the right global bit line, and at least one of two bit lines connected to the third switching portion is connected to the upper stage of the left global bit line and the other of the two bit lines connected to the third switching portion is connected to the lower stage of the right global bit lines.

4. A memory device, comprising:
    first and second parallel global bit lines, the first global bit line being divided into upper and lower portions by a first switching device, the second global bit line being divided into upper and lower portions by a second switching device;
    a first array of memory cells positioned between the upper portions of the first and second global bit lines, wherein the memory cells of the first array are positioned at the intersection of first word lines and a first pair of local bit lines;
    a second array of memory cells positioned between the lower portions of the first and second global bit lines, wherein the memory cells of the second array are positioned at the intersection of second word lines and a second pair of local bit lines;
    a third switching device coupled between one of the pair of local bit lines of the first array and the upper portion of the first global bit line;
    a fourth switching device coupled between the other of the pair of local bit lines of the first array and the lower portion of the first global bit line;
    a fifth switching device coupled between one of the pair of local bit lines of the second array and the upper portion of the second global bit line; and
    a sixth switching device coupled between the other of the pair of local bit lines of the second array and the lower portion of the second global bit line.

5. The memory device of claim 4, further comprising a first sense amplifier coupled to the upper portions of the first and second global bit lines, and a second sense amplifier coupled to the lower portions of the first and second global bit lines.

6. The memory device of claim 5, wherein the first word lines are coupled to a first row decoder, and the second word lines are coupled to a second row decoder.

7. The memory device of claim 5, further comprising a first precharge circuit coupled to the first pair of local bit lines of the first array, and a second precharge circuit coupled to the second pair of local bit lines of the second array.

8. The memory device of claim 5, wherein the first and second sense amplifiers are coupled to a column decoder.

9. The memory device of claim 4, wherein the first, second, third, fourth, fifth and sixth switching devices comprise MOS transistors.

10. The memory device of claim 4, wherein the first word lines are coupled to a first row decoder, and the second word lines are coupled to a second row decoder.

11. The memory device of claim 4, further comprising a first precharge circuit coupled to the first pair of local bit lines of the first array, and a second precharge circuit coupled to the second pair of local bit lines of the second array.

12. A memory device, comprising:
    first and second parallel global bit lines, the first global bit line being divided into upper and lower portions by a first switching device, the second global bit line being divided into upper and lower portions by a second switching device;
    a first array of memory cells positioned between the upper portions of the first and second global bit lines, wherein the memory cells of the first array are positioned at the intersection of first word lines and a first pair of local bit lines;
    a second array of memory cells positioned between the lower portions of the first and second global bit lines, wherein the memory cells of the second array are positioned at the intersection of second word lines and a second pair of local bit lines;

a third switching device coupled between one of the pair of local bit lines of the first array and the upper portion of the first global bit line;

a fourth switching device coupled between the other of the pair of local bit lines of the first array and the lower portion of the second global bit line;

a fifth switching device coupled between one of the pair of local bit lines of the second array and the upper portion of the second global bit line; and a sixth switching device coupled between the other of the pair of local bit lines of the second array and the lower portion of the first global bit line.

13. The memory device of claim 12, further comprising a first sense amplifier coupled to the upper portions of the first and second global bit lines, and a second sense amplifier coupled to the lower portions of the first and second global bit lines.

14. The memory device of claim 13, wherein the first word lines are coupled to a first row decoder, and the second word lines are coupled to a second row decoder.

15. The memory device of claim 13, further comprising a first precharge circuit coupled to the first pair of local bit lines of the first array, and a second precharge circuit coupled to the second pair of local bit lines of the second array.

16. The memory device of claim 13, wherein the first and second sense amplifiers are coupled to a column decoder.

17. The memory device of claim 12, wherein the first, second, third, fourth, fifth and sixth switching devices comprise MOS transistors.

18. The memory device of claim 12, wherein the first, second, third, fourth, fifth and sixth switching devices comprise NMOS transistors.

19. The memory device of claim 12, wherein the first word lines are coupled to a first row decoder, and the second word lines are coupled to a second row decoder.

20. The memory device of claim 12, further comprising a first precharge circuit coupled to the first pair of local bit lines of the first array, and a second precharge circuit coupled to the second pair of local bit lines of the second array.

* * * * *